United States Patent [19]
Yamaguchi

[11] Patent Number: 4,796,273
[45] Date of Patent: Jan. 3, 1989

[54] DISTRIBUTED FEEDBACK SEMICONDUCTOR LASER

[75] Inventor: Masayuki Yamaguchi, Tokyo, Japan

[73] Assignee: NEC Corporation, Tokyo, Japan

[21] Appl. No.: 840,818

[22] Filed: Mar. 18, 1986

[30] Foreign Application Priority Data

Mar. 20, 1985 [JP] Japan .................................. 60-57334

[51] Int. Cl.⁴ ............................................... H01S 3/08
[52] U.S. Cl. ........................................ 372/96; 372/45; 372/49; 372/102; 372/18
[58] Field of Search ..................... 372/96, 102, 49, 45, 372/46, 18, 19, 20

[56] References Cited

U.S. PATENT DOCUMENTS

3,970,959 7/1976 Wang et al. ............................ 372/96

OTHER PUBLICATIONS

Yamaguchi et al., "Highly Efficient Single Longitudinal-Mode Operation of Antireflection-Coated 1.3 μm, DFB-DC-PBH-LD", Electronics Letters, Mar. 16, 1984, vol. 20, No. 6, pp. 233-235.

Eda et al., "High Efficiency Active Distributed-Reflector Lasers of Asymmetric Structure", National Conference Record, 1984, Optical and Radio Wave Electronics, The Institute of Electronis and Communication Engineers of Japan, Part 2, paper No. 271, pp. 2-15.

Utaka et al., "Analysis of Quarter-Wave-Shifted DFB Laser", Electronics Letters, 12th Apr. 1984, vol. 20, No. 8, pp. 326-327.

Akiba et al, "λ/4-Shift InGaAsP/InPo DFB Lasers by Simultaneous Exposure of Positive and Negative Photoresists", National Conference Record, 1984 Optical and Radio Wave Electronics, Part 2, Paper No. 265, Oct. 1984, The Institute of Electronics and Communication Engineers of Japan.

Primary Examiner—William L. Sikes
Assistant Examiner—Georgia Y. Epps
Attorney, Agent, or Firm—Sughrue, Mion, Zinn, Macpeak, and Seas

[57] ABSTRACT

A DFB semiconductor laser with an optical waveguide formed on a semiconductor substrate of a first conductivity type. The optical waveguide includes an active layer for emitting light and an optical waveguide layer adjacent the active layer. Facets of different reflectivities are provided at the ends of the light emitting region. A diffraction grating in the form of a periodic corrugation structure with a phase shift region is provided in the waveguide layer in the direction of light travel. The phase shift region is located nearer to the end facet of higher reflectivity than the end of lower reflectivity to produce a low oscillation threshold current and with it a stable single oscillation wavelength.

12 Claims, 2 Drawing Sheets

DISTRIBUTED FEEDBACK SEMICONDUCTOR LASER

BACKGROUND OF THE INVENTION

This invention relates to a distributed feedback semiconductor laser (referred to as DFB laser) which oscillates at a stable single wavelength.

A DFB semiconductor laser with its distributed feedback is able to oscillate at a single wavelength Wavelength selectivity is effected by a diffraction grating formed in the element. Optical fiber communication systems using as a light source such a single wavelength oscillation semiconductor laser has the advantage that despite wavelength dispersion caused by the optical fibers the optical signal transmitted through the optical fibers will not be subjected to distortion over long-distance transmission. DFB lasers therefore are promising as a light source for long-haul optical fiber communication.

The conventional DFB laser has a band with no oscillation mode, which is called stopband, in the vicinity of the Bragg wavelength determined by the period of the diffraction grating, and two oscillatory modes existing on both sides of the stopband. Owing to this, all elements do not oscillate at a single wavelength and some oscillate in two axial modes. For solving this problem, it has been proposed in, a published paper, Electronics Letters Vol. 20 (No. 8) pp. 326–327, issued on Apr. 12, 1984, to use a λ/4-shifted DFB laser which has a diffraction grating structure with a λ/4-shift region at the center of the DFB laser, the character λ being the wavelength of light propagating therein. This laser can have a stable single oscillation at the Bragg wavelength because the threshold gain of the main mode (corresponding to the Bragg wavelength mode) oscillation is remarkably low compared with that of a side mode oscillation. The paper also discloses the theoretical study on such lasers either with an unreflective facet at each end or with an unreflective facet at one end and a 30% reflectivity cleavage facet at the other end, leading to the conclusion that the λ/4-shift region may be ideally located at the center of the element.

The inventor's study revealed that the above stated conclusion; that is the λ/4-shift region should be located at the center of the elements is not always so: though it is appropriate when the end facets are unreflective or equally reflective. However, the inventor determined that the optimum location of the λ/4-shift region should be deviated from the center of the element when the end facets have different reflectivities.

N. Eda et al discloses a theoretical study on the increase in efficiency of a λ/4-shifted DFB laser diode upon the introduction therein of structural asymmetry. (See the paper entitled "High Efficiency Active Distributed-Reflector Lasers of Asymmetric Structure", NATIONAL CONFERENCE RECORD, 1984 OPTICAL AND RADIO WAVE ELECTRONICS, PART 2, PAPER No. 271, October 1984, THE INSTITUTE OF ELECTRONICS AND COMMUNICATION ENGINEERS OF JAPAN.) Such asymmetry introduces a difference in lengths between the left and right regions with respect to the λ/4-shift region and a difference in coupling coefficients of light with the grating between the left and right regions. However, in the paper, the ends of the DFB laser are assumed to be reflection-free and no suggestion is given as to the location of the phase shift region for establishing stable single wavelength oscillation when the ends have different reflectivities.

Further it is known concerning the DFB laser that to suppress Fabry-Perot mode oscillation, which is generally unnecessary for the laser, and to increase the efficiency of the light taken from the front facet, the front facet of the element is frequently coated with an antireflection coating, as exemplified in the report, Electronics Letters Vol. 20 (No. 6), pp 233–235, issued on Mar. 15, 1984, in which is found no description of where a λ/4-shift region should be located.

SUMMARY OF THE INVENTION

It is the principal object of the invention to provide a DFB laser which has ends of different reflectivities and which is capable of exhibiting a stable single wavelength oscillation.

The distributed feedback semiconductor laser according to the invention comprises a stripe-shaped light emitting region, a periodic corrugation structure disposed in the advancing direction of light and adjoining the stripe-shaped light emitting region, and facets of different reflectivities at the ends of the light emitting region. The periodic corrugation structure has a phase shift region located nearer to the end facet of higher reflectivity. The phase shift region is adapted to cause a desired optical phase shift to the light travelling therein. In the DFB laser, it is particularly preferable that the length of the phase shift region be set to $(1+2n)/4$ times (n: 0 or positive integer) the wavelength of the light travelling the phase shift region or to $\pi/2$ times the inverse of the difference in propagation constant between when the light is travelling the phase shift region and when travelling the other regions of the periodic corrugation structure, so that the optical phase shift caused by the phase shift region may be $\pi/2$.

DETAILED DESCRIPTION OF THE PREFERRED EMBODIMENTS

Figure 1A:
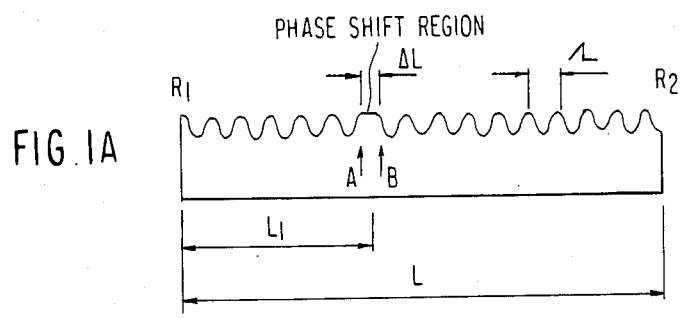
FIG. 1A is a longitudinal sectional view of a diffraction grating and illustrates the principle of the invention.

Prior to describing particular embodiments of the invention, the principle of the λ/4-shifted DFB laser will be elucidated. FIG. 1A shows in longitudinal section a diffraction grating configuration used in a λ/4-shifter DFB laser according to the invention. The period of the diffraction gratings is generally set as expressed by the formula:

$$\Lambda = m\lambda_g/2,$$

where $\lambda_g$ is the wavelength of light travelling in a semiconductor under consideration and m is an integer of 1 or higher value. For simplification of description herein, it is assumed to be a primary diffraction grating of m=1. Assuming that the DFB laser has end facets of different reflectivities $R_1$, $R_2$ and a diffraction grating with a plateau phase-shift region, the phases of the reflected lights at Bragg wavelengths when viewed left from point A and right from point B in FIG. 1A are both $\pi/2$. The conventional laser without phase-shift region, that is L=0, produces a phase difference of $\pi$ with respect to light circling at the Bragg wavelength in the resonator, resulting in no oscillation at the Bragg wavelength. On the other hand, in the $\lambda/4$-shifted DFB laser, if the phase-shift region (herein for convenience, taken as the plateau extending between the centers of adjacent corrugations) located at the center of the element (length=L) as shown, has a length $\lambda_g/4$, then light is caused to shift by $\pi/2$ as it passes the region. Phase shift therefore is $\pi$ over each round trip, with the resultant cancellation of a phase difference, whereby a stable, single Bragg wavelength oscillation is obtained.

As above-stated, in the conventional $\pi/4$-shifted DFB laser, the phase shift region permits phase matching at the Bragg wavelength to establish a stable single oscillation at the Bragg wavelength, and it has been considered optimum to locate the phase shift region at the center of the element. For obtaining a more stable single Bragg wavelength oscillation, however, it is desirable to provide intensity matching of reflected lights from the right and left ends as well as phase matching. This is achieved by locating the phase-shift region at the position where the intensities of the reflected lights are equal. Usually, when the reflectivities of the ends are different, the position where the intensities of the reflected lights from the ends are equal is nearer than the center of the element to the higher reflectivity end. It therefore can be expected that for obtaining more stable Bragg wavelength mode oscillation, the phase-shift region should be optimally located nearer to the higher reflectivity end than the center.

Figure 1B:
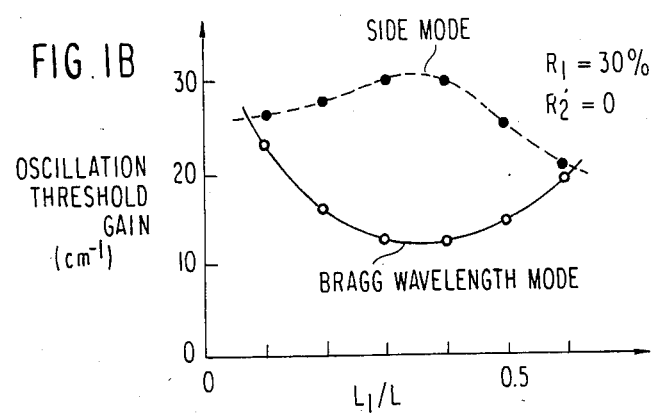
FIG. 1B shows oscillatory threshold gain curves of a Bragg wavelength mode and a side mode, respectively.

This can be demonstrated by the following examination: FIG. 1B illustrates the changes in the oscillation threshold gain of the Bragg wavelength mode and the side modes. When $L_1/L$ (where $L_1$ is the length between the phase-shift region and the higher reflectivity end and L is the overall length of the grating) is 0.3 to 0.4, the oscillation threshold gain in the Bragg wavelength mode becomes minimum, and that in the side mode is maximum. This supports that the phase-shift region should be located at the position of the 3:7 to 4:6 ratio internal division between the ends and thus nearer to the higher reflectivity end. As the result, a stable single wavelength oscillation can be obtained with the side mode oscillation suppressed. Moreover when the reflectivities of the ends are equal, that is $R_1=R_2$, the phase-shift region may be optimally located at the center of the element as in the prior art.

EXAMPLE 1

Figure 2:
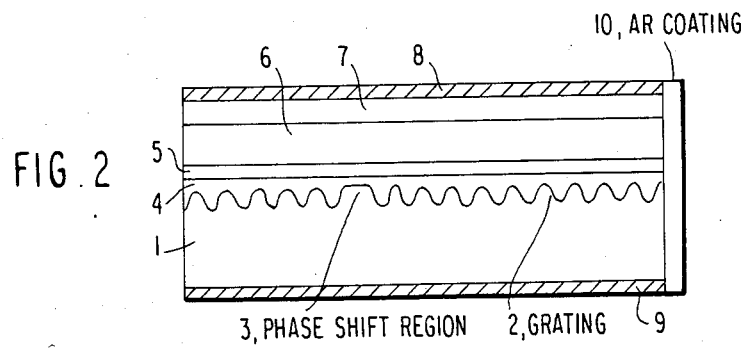
FIGS. 2 and 3 are longitudinal sectional views illustrating the first and second embodiments of the invention.

FIG. 2 shows in cross-sectional view an embodiment of a DFB laser according to the invention which is obtained as follows: On an n-InP substrate 1, a diffraction grating 2 of 2000 Å in period and a plateau phase-shift region 3 of $\lambda_g/4$ (about 1000 Å) in length are formed, for example, by electron beam exposure technique and chemical etching technique. The phase-shift region 3 is at the position between the ends corresponding to the ratio 0.35:0.65. Subsequently an n-InGaAsP optical waveguide layer 4 (having an energy bandgap 1.1 microns in terms of wavelength), a non-doped InGaAsP active layer 5 (1.3 microns in terms of wavelength), P-InP clad layer 6, and P+-InGaAsP cap layer 7 are grown epitaxially in sequence to the thicknesses of 0.1, 3 and 0.5 microns, respectively. On the surfaces of the resulting multi-layer semiconductor wafer, electrodes 8, 9 are formed. An antireflection coating film as of SiN is formed at the remote end from the phase-shift region 3. The thus-obtained desired-structure DFB laser has a maximum threshold gain difference between the Bragg wavelength mode and the side modes, resulting in a stable single Bragg wavelength oscillation.

Such diffraction grating with the phase-shift region 3 can be fabricated by the simultaneous holographic exposure technique disclosed in the Akiba et al paper entitled "$\lambda/4$-shift InGaAsP/InP DFB Lasers by Simultaneous Exposure of Positive and Negative Photoresists", NATIONAL CONFERENCE RECORD, 1984 OPTICAL AND RADIO WAVE ELECTRONICS, PART 2, PAPER NO. 265, October 1984, THE INSTITUTE OF ELECTRONICS AND COMMUNICATION ENGINEERS OF JAPAN. The length $\Delta L$ of the phase-shift region 3 may be $\Delta L=\lambda_g(1+2n)/4$, where n is an integer of 0 or higher value, instead of $L=\lambda_g/4$ in this Example. In other words, n is not always necessary to be zero because the phase of the light passing the phase shift region 3 is made to shift by $\pi/2$ each way.

EXAMPLE 2

In this Example, a DFB laser having a phase shift region more readily fabricated will be described.

Figure 3:
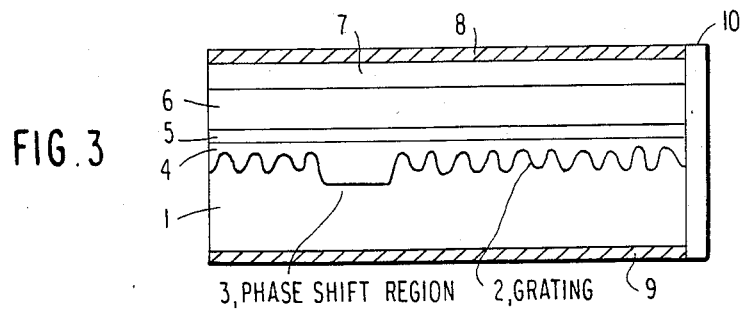

FIG. 3 illustrates a longitudinal sectional view of a DFB laser which is fabricated as follows: On an n-InP substrate is formed a diffraction grating 2 with a uniform period of 2000 Å in a conventional way by the holographic exposure method and the chemical etching technique. A part of the diffraction grating 2 is removed by etching at the position of the 0.35 to 0.65 ratio internal division between the ends, providing a phase-shift region 3 measuring 1 micron deep and about 20 microns long. An n-InGaAsP optical waveguide layer 4, a non-doped InGaAsP active layer 5, P-InP clad layer 6 and P+-InGaAsP cap layer 7 are grown epitaxially. The optical waveguide layer 4 is about 1 micron thick where it overlies the diffraction grating 2 with particular exception of about 2 microns thick where it overlies the phase shift region 3. The thicknesses of the other layers are the same as those in Example 1. The composition ratios of the optical waveguide and the active layers are also the same as those in Example 1. To the resulting multi-layer semiconductor wafer, electrodes 8, 9 are formed on the exposed surfaces, and an antireflection coating 10 at the remote end from the phase-shift region. Owing to the difference between the thicknesses of portions of the optical waveguide layer 4 overlying the right and left grating regions 2 and the phase shift region 3, respectively, their equivalent refractive indexes are different, with the consequent difference in propagation constant of light between them. Assuming that the difference in propagation constant is $\Delta B$ and the length $\Delta L$ of the phase shift region 3 is $\Delta L=\pi/2\Delta\beta$, then the phase shift is equivalent to $\pi/2$ each one way when light passes over the phase shift region 3. When, as in this Example, the portion of the optical waveguide layer 4 overlying the phase shift region 3 is approximately 1 micron thicker than the portions overlying the left and right grating regions 2, the above-mentioned difference in propagation constant is about 0.08 rad/micron. It therefore follows that the length of the phase-shift region 3 may be 20 micron.

The DFB laser of Example 2 is equivalent in effect to the λ/4-shifted structure and can have a stable single Bragg wavelength oscillation in the same way as the λ/4-shifted DFB laser of Example 1. The DFB laser of this Example is advantageous over the Example 1 DFB laser, in that the phase shift region 3 may be formed after the diffraction grating 2 has been formed uniformly over the entire surface of the InP substrate 1.

Further the optical waveguide layer 4 may be thinner, in the portion overlying the phase shift region 3 instead of being thicker in the same portion in this Example 2.

EXAMPLE 3

Figure 4A:
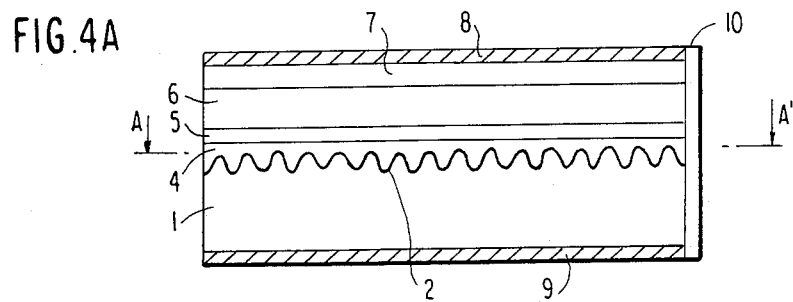
FIG. 4A is a longitudinal sectional view illustrating the third embodiment of the invention.
Figure 4B:
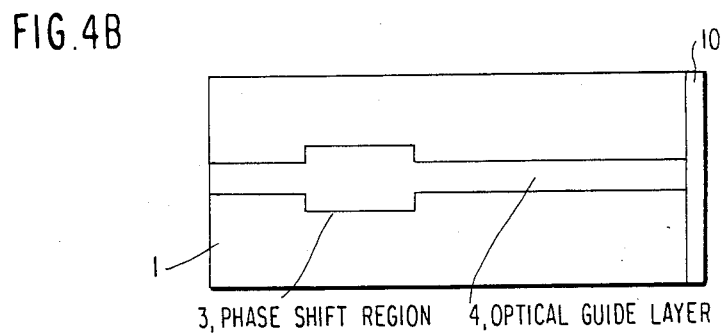
FIG. 4B is a horizontal sectional view taken along line A—A of FIG. 4A.

FIGS. 4A and 4B show, in longitudinal and horizontal sectional views, respectively, the third embodiment of the DFB laser of the invention which has an equivalent phase shift region 3 is simply manufacturable as follows: firstly a diffraction grating 2 having a uniform period of 2000 Å is formed on an n-InP substrate 1. An n-InGaAsP optical waveguide layer 4, followed by a non-doped InGaAsP active layer 5 each of stripe-shape with a widened portion at the position of the 0.35 to 0.65 ratio of the distance between the ends are formed. Then over the entire surface are grown a P-Inp clad layer 6, and a P-InGaAsP cap layer 7 in sequence. Both the optical waveguide layer 4 and the active layer 5 are of stripe-shape with the wider portion of 3 microns in width and about 40 microns in length which corresponds to the phase shift region 3 in Examples 1 and 2 and the remaining narrower portions of 2 microns in width. The thicknesses of the component layers are the same as in Example 1. Subsequently electrodes 8, 9 are formed on the exposed surfaces of the resulting multilayer semiconductor wafer, and an antireflection coating 10 is formed at the remote end from the phase-shift region 3. This structure also contributes to making a difference in propagation constant of about 0.04 rad/micron between the narrower portions or regions and the wider portion, that is, the phase shift region 3. Accordingly the phase shift region 3, assuming it is about 40 microns long, contributes equivalently to a λ/4-shift as in Example 2. Also this DFB laser can have a stable single Bragg-wavelength oscillation.

In this Example, the diffraction grating 2 extends alongside the phase shift region 3. This structure is allowed because the length of the phase shift region 3 is much less than that of the overall length of the resonator (approximately 300 microns long), with consequent little influence of the diffraction grating 2 remaining alongside the phase shift region 3. However, it is more preferable that the diffraction grating 2 be lacking alongside the phase shift region 3. The phase shift region 3 may be narrow compared with the other regions instead of being wider as in this Example.

In the above-described Examples, there is formed an antireflection coating 10 at one of the ends, which does not limit the end structure, and the invention is applicable so far as the reflectivities of the end facets are different. For example, when one end is reflection-free and the other end is high reflective (about 80%), the phase shift region is optimal to be located at the position of the 0.2 to 0.8 ratio of the distance between the higher reflective and antireflective ends.

The invention is applicable not only to these Examples of 1.3 micron DFB laser but also to DFB lasers of other wavelength bands. Instead of the disposition of the diffraction grating 2 underlying the active layer 5 in these Examples, it may be such structure that the optical waveguide layer 4 overlies the active layer 5, and the diffraction grating 2 overlies the optical waveguide layer 4.

Although, in these Examples, the phase shift region is set to such a length that it effects a phase shift of $\pi/2$, it is not always necessary to be $\pi/2$ because its effect is substantially attained in the range between $\pi/4$ to $7\pi/4$. The location of the phase shift region 3 at the position which is at the 0.35:0.65 ratio of the distance between the ends and nearer to the higher reflectivity end, as stated in these Examples, is not limitive but the phase-shift region 3 is merely conditioned to be located considerably nearer to the higher reflectivity end than is the center of the element because, if so, the difference between the threshold gains of the main and side mode oscillations can be appreciably great compared with that of the DFB laser with the phase shift region 3 at the center of the element.

The advantages of the DFB laser according to the invention resides, compared with conventional DFB lasers, for example, without phase shift region or with it at the center, in that it has a low oscillation threshold current and so it can have a stable single oscillation, contributing to improvement in yield of such a single oscillation DFB laser, and be free of a change in oscillation mode associated with high-speed modulation and long-term use.

What is claimed is:

1. A distributed feedback semiconductor laser comprising:
    a semiconductor substrate of a first conductivity type;
    an optical waveguide formed on said substrate;
    a clading layer of a second conductivity type formed on said optical waveguide, said optical waveguide including an active layer for emitting light and a guide layer positioned adjacent to said active layer and provided with a periodic corrugation structure for guiding and said guide layer being interacting the light emitted from said active layer;
    facets of different reflectivities at the ends of said optical waveguide, said periodic corrugation structure having a phase shift region located nearer the end facet of higher reflectivity for causing an optical phase shift ranging between $\pi/4$ to $7\pi/4$ to the light travelling said periodic corrugation structure; and
    a pair of electrodes for injecting a current into said active layer for excitation.

2. A distributed feedback semiconductor laser defined in claim 1 wherein the length of said phase shift region is $\pi/2$ times the inverse of the difference in propagation constant between when light is travelling said phase shift region and when travelling the other regions of said periodic corrugation structure so that said optical phase shift caused by said phase shift region may be $\pi/2$.

3. A distributed feedback semiconductor laser defined in claim 1, wherein said optical phase shift is $\pi/2$.

4. A distributed feedback semiconductor laser as defined in claim 1 wherein said phase shift region is positioned at a location from the higher reflectivity end facet corresponding to 35% of the distance between the ends of the optical waveguide.

5. A distributed feedback semiconductor laser as defined in claim 1, wherein said guide layer is formed adjacent said substrate, said periodic corrugation structure is located between said substrate and said guide layer, and said active layer is formed over said guide layer.

6. A distributed feedback semiconductor laser as defined in claim 5 wherein said phase shift region is positioned at a location from the higher reflectivity end facet corresponding to substantially 35% of the distance between the ends of the optical waveguide.

7. A distributed feedback semiconductor laser as defined in claim 1, wherein said substrate is n-InP, said guide layer is n-InGaAsP, said active layer is non-doped InGaAsP, said cladding layer is a clad layer of p-InP, and the lower reflectivity end facet has an anti-reflection coating of SiN.

8. A distributed feedback semiconductor laser as defined in claim 1, wherein said phase shift region is a plateau phase-shift region of $\delta g/4$ in length, where $\delta g$ is the wavelength of light traveling in the laser.

9. A distributed feedback semiconductor laser as defined in claim 1 wherein said phase shift region is a valley phase-shift region forming a depression in said substrate extending below said periodic corrugation structure.

10. A distributed feedback semiconductor laser as defined in claim 1, wherein said guide layer and said active layer are stripe-shaped, each with a widened portion positioned at a location from the higher reflectivity end facet corresponding to substantially 35% of the distance between the ends of the optical waveguide, said widened portion forming said phase shift region.

11. A distributed feedback semiconductor laser as defined in claim 1 wherein said guide layer and said active layer are stripe-shaped, each with a narrowed portion positioned at a location from the higher reflectivity end facet corresponding to substantially 35% of the distance between the ends of the optical waveguide, said narrowed portion forming said phase shift region.

12. A distributed feedback semiconductor laser as defined in claim 1 wherein said phase shift region is positioned at a location from the higher reflectivity end facet corresponding to substantially 20% of the distance between the ends of the optical waveguide.

* * * * *

UNITED STATES PATENT AND TRADEMARK OFFICE
CERTIFICATE OF CORRECTION

PATENT NO. : 4,796,273
DATED : January 3, 1989
INVENTOR(S) : MASAYUKI YAMAGUCHI

It is certified that error appears in the above-identified patent and that said Letters Patent is hereby corrected as shown below:

Column 7, line 18, delete "$\delta g/4$" and insert --$\lambda g/4$--.
delete "$\delta g$" and insert --$\lambda g$--.

Signed and Sealed this

Nineteenth Day of September, 1989

Attest:

DONALD J. QUIGG

Attesting Officer

Commissioner of Patents and Trademarks